United States Patent
Suortti et al.

(10) Patent No.: US 7,547,367 B2
(45) Date of Patent: Jun. 16, 2009

(54) METHOD FOR PRODUCING MAGNETICALLY ACTIVE SHAPE MEMORY METAL ALLOY

(75) Inventors: Tuija Suortti, Pori (FI); Juha Järvi, Ulvila (FI); Pekka Taskinen, Pori (FI)

(73) Assignee: Outotec Oyj, Espoo (FI)

( * ) Notice: Subject to any disclaimer, the term of this patent is extended or adjusted under 35 U.S.C. 154(b) by 298 days.

(21) Appl. No.: 10/563,173

(22) PCT Filed: Jul. 3, 2003

(86) PCT No.: PCT/FI03/00538

§ 371 (c)(1),
(2), (4) Date: Dec. 30, 2005

(87) PCT Pub. No.: WO2005/002762

PCT Pub. Date: Jan. 13, 2005

(65) Prior Publication Data

US 2007/0102067 A1    May 10, 2007

(51) Int. Cl.
*H01F 1/14* (2006.01)
*C22F 1/10* (2006.01)
(52) U.S. Cl. ................ 148/563; 148/100; 148/121
(58) Field of Classification Search ............... None
See application file for complete search history.

(56) References Cited

U.S. PATENT DOCUMENTS 6,475,261 B1   11/2002   Matsumoto et al.

OTHER PUBLICATIONS

ASM Handbook, Formerly Ninth Edition, Metals Handbook, vol. 15, Casting, 1988, pp. 319 to 323.*
A Dictionary of Metallurgy, by A.D. Merriman, 1958, p. 30.*
Scripta Materialia, vol. 48, 2003, G. Mogylnyy et al, "Crystal Structure and Twinning in Martensite of Ni1.96 Mn1.18Ga0.86 Magnetic Shape Memory Alloy," available online at www.sciencedirect.com, pp. 1427-1432.
Journal of Alloys and Compounds, vol. 312, 2000, D.L. Schlagel et al, "Chemical Segregation During Bulk Single Crystal Preparation of Ni-Mn-Ga Ferromagnetic Shape Memory Alloys," available online at www.sciencedirect.com, pp. 77-85.
Scripta Materialia, vol. 36, No. 10, 1997, K. Ullakko et al, "Magnetically Controlled Shape Memory Effect in Ni2MnGa Intermetallics," available online at www.sciencedirect.com, pp. 1133-1138.

* cited by examiner

*Primary Examiner*—John P. Sheehan
(74) *Attorney, Agent, or Firm*—Smith-Hill & Bedell, P.C.

(57) ABSTRACT

The invention relates to a method for producing magnetically active shape memory metal alloy, said metal alloy containing nickel, manganese and gallium. In the method, the different components of the metal alloy are melted, and the melt is homogenized essentially at the melting temperature; the obtained metal alloy is cast, and the cast metal alloy is subjected to directional solidification at 10-100° C. below the liquidus temperature of said metal alloy.

4 Claims, No Drawings

METHOD FOR PRODUCING MAGNETICALLY ACTIVE SHAPE MEMORY METAL ALLOY

This is a national stage application filed under 35 USC 371 based on International Application No. PCT/FI2003/000538 filed Jul. 3, 2003.

The present invention relates to a method for producing a shape memory metal alloy containing nickel, manganese and gallium by casting, by applying directional solidification, so that the crystal structure of the shape memory metal alloy gets large crystals and is directional in a desired way.

Magnetically active or controlled metal is a material that makes the objects made thereof to be reshaped in a controlled fashion—they are wound, stretched and bent owing to the effect of an external, adjustable magnetic field. The behavior of memory metal is described for instance in the Finnish patent 101,563. The transformation is based on a reorientation of the microstructure of the material owing to a magnetic field. The basis for the transformation is a twinned martensitic microstructure, the orientation whereof can be controlled. The martensitic structure is achieved directly by means of casting technique and/or heat treatment. In addition, in order to enable the transformation to take place, the material must be magnetically hard, in which case the magnetic vectors of the lattice must not turn more easily than the crystal lattice. Thus the inner magnetic field strongly remains in a given lattice orientation, and as the inner magnetic field turns, the lattice turns along with it.

From the point of view of magnetically active memory metal, important quantities are the temperatures of the martensite and austenite phase formation reactions, where the phases start to be formed ($M_s$ and $A_s$) and where the phase formation ends ($M_f$ and $A_f$). In addition, an important quantity from the point of view of magnetically active memory metal is the Curie temperature $T_c$. With ferromagnetic materials, the Curie temperature is a temperature below which spontaneous magnetization occurs, but above which the materials are paramagnetic. By means of these quantities, there is defined, among others, the usage temperature of said material or alloy. The usage temperature is below the Curie temperature (the material must be ferromagnetic) and below the start temperature of the martensite reaction (the material must also be martensitic). From the point of view of the usage of the material, it is advantageous that said temperatures are as high as possible, so that the usability range of the magnetically active memory metal is sufficiently wide, and allows for instance for the heating of equipment owing to climatic conditions or during usage.

As a memory metal containing nickel, manganese and gallium, the general form of which is referred to as NiMnGa in the specification below, is cooled off, the austenitic structure begins to turn into martensitic, when cooling in the temperature range $M_s \rightarrow M_f$, and when respectively heating in the opposite direction, there is created austenite $A_s \rightarrow A_f$. In the NiMnGa system, there occur different phases, i.e. various paramagnetic and ferromagnetic forms of the cubic and tetragonal phase. There is a connection between the crystal structure and the transformation temperatures. Alloys where the transformation temperatures are lower than 70° C. have a modulated 5-layered (5M) tetragonal structure. A 7-layered orthorhombic (7M) structure is possible in the temperature range 70° C.-$T_c$. Above the Curie temperature, the structure is a non-modulated tetragonal (T) martensite.

The patent application EP 866142 relates to a NiMnGa alloy, particularly to the chemical form $Ni_{2+x}Mn_{1-x}Ga$ of said alloy, where the parameter x (in moles) is selected within the range $0.10 <= x <= 0.30$. With this composition, the finish temperature of the martensitic transformation can be selected as a desired temperature between −20° C. and 70° C., whereas the Curie temperature can be selected as a desired temperature between 60° C. and 85° C. In the memory metal feature of the alloy, there is connected martensitic transformation Ms ? Mf and reverse transformation $A_s \rightarrow A_f$. A typical feature of the NiMnGa alloy described in the EP patent application is that the reverse transformation is in the martensite phase achieved by means of an external magnetic field, and as a result, the shape memory is recovered. In the EP patent application 866,142, there is described how the treated NiMnGa alloys are manufactured as follows: the NiMnGa alloy ingots were produced by mixing the alloy ingredients, by melting the mixture by the argon arch method and by casting it into ingots. Thereafter the ingots were ground into NiMnGa alloy powder. The powder was screened to the particle sized below 250 mesh, and it was further compacted into a bar with a diameter of 5 mm. The compacted bar was sintered at the temperature of 800° C. for the duration of 48 hours. For the obtained alloy, there was defined the finish temperature $A_f$ of the reverse transformation and the Curie temperature $T_c$. Consequently, in the production of the alloy according to the EP patent application 866,142, for instance the crystal structure of the alloy or the effect of the crystal structure in the memory metal properties were not in any way taken into account. Further, in the method according to the EP patent application 866,142, there is utilized powder metallurgy, which as such makes the production difficult and thus increases the manufacturing expenses.

The object of the present invention is to eliminate some of the drawbacks of the prior art and to realize an improved method that is more secure in operation for producing a magnetically active shape memory metal alloy containing nickel, manganese and gallium, so that for the alloy, there is obtained a crystal structure that is advantageous for the memory metal properties and so that for example the powder metallurgy step is avoided. The essential novel features of the invention are enlisted in the appended claims.

By applying the method according to the invention, there is manufactured by casting a magnetically active shape memory metal alloy containing nickel, manganese and gallium, in which alloy the contents of the various components may vary so that the nickel content is within the range 45-60 atom %, the manganese content is within the range 15-35 atom % and the gallium content is within the range 15-30 atom %. First the components used in the method are melted and cast in a controlled atmosphere and pressure, so that the volatilization of the alloy components is essentially prevented, and the composition of the cast object is advantageously made homogeneous. The desired metal alloy obtained by casting is solidified by means of directional solidification below the liquidus temperature of the balance diagram of the metal alloy, within the temperature range 1050-1200° C., advantageously 1120-1170° C., in which case the crystal structure of the metal alloy becomes a directional texture structure, which is important for a magnetically active memory metal in order to maximize the stretch.

According to the invention, in order to create the metal alloy, the nickel, manganese and gallium contained in the alloy are charged, preferably as Ni—Mn and/or Ni—Ga master alloys, and the precision is carried out by pure metal. The master alloys are advantageously produced so that the lowest material is gallium with the lowest melting temperature (30° C.), on top of it there is placed manganese (1246° C.) and topmost nickel (1455° C.). The melting of the master alloy is preferably carried out inductively at the temperature of 1500°

C., in which temperature the melt is kept for about 1 hour in order to homogenize the alloy, whereafter the master alloy is cooled and crushed into pieces that fit in the crucible. The metal alloy proper, NiMnGa, is advantageously produced so that lowest on the bottom there is placed the precision metal, and on top of it, the master alloy or alloys. Melting is preferably carried out inductively at the temperature 1300° C., in which temperature the melt is kept for about 1 hour in order to homogenize the alloy. The casting of the metal alloy NiMnGa is performed at the temperature of about 1180° C., and the temperature of the furnace of directional solidification is advantageously about 1130° C. The evaporation of volatile components, such as manganese and gallium, is controlled by adjusting in the furnace an underpressure within the range 20-200 mbar.

The solidification of a casting piece obtained in the method according to the invention is advantageously carried out at 10-100° C. below the liquidus temperature of the metal alloy. The solidification rate of the casting piece is within the range 0.1-50 mm/min, preferably 1-20 mm/min. In the solidification process, there is advantageously used a temperature gradient furnace substantially in standard conditions, in which furnace the heat is essentially conducted away from the lengthwise direction of the cast molding. Thus the solidification temperature is changed in an essentially even fashion, and the obtained crystal structure for the solidified metal alloy is a directional texture structure. As a consequence of directional solidification, there is achieved a strongly anisotropic casting, as the mechanically weak granule borders are set in the lengthwise direction of the casting. Hence for example the strength properties of the casting are different in different directions.

The casting piece obtained in the method according to the invention is homogenized in protective gas atmosphere within the temperature range 800-1000° C., in which temperature range the stability area of the so-called Heusler phase contained in the nickel-manganese-gallium alloy is preferably large. The employed protective gas can advantageously be for instance argon, nitrogen or a combination thereof.

For the metal alloy produced according to the method of the invention, there were measured the start temperatures ($M_s$, $A_s$) and finish temperatures ($M_f$, $A_f$) of the martensite and austenite reactions, as well as the Curie temperature ($T_c$). The measurement results are represented in the table below:

| Alloy | Ni at % | Mn at % | Ga at % | $M_s$ ° C. | $M_f$ ° C. | $A_s$ ° C. | $A_f$ ° C. | $T_c$ ° C. |
|---|---|---|---|---|---|---|---|---|
| 1 | 49.6 | 28.4 | 22 | 33 | 31 | 37 | 40 | 99 |
| 2 | 48.5 | 30.3 | 21.2 | 28.5 | 26 | 32 | 35 | 99 |
| 3 | 48.4 | 31.1 | 20.5 | 34 | 32 | 42 | 45 | 97 |
| 4 | 50.7 | 27.8 | 21.5 | 52 | 50 | 58 | 61 | 98 |
| 5 | 48.9 | 30.8 | 20.3 | 51.3 | 48 | 58.5 | 62 | 96.8 |
| 6 | 49.9 | 29.9 | 20.2 | 70.6 | 65 | 76.7 | 81.1 | 95.7 |
| 7 | 50.5 | 29.4 | 20.1 | 78.6 | 68.4 | 75.4 | 86 | 93 |

From the table it is seen that the Curie temperature of the metal alloys is remarkably higher than room temperature, which means that at room temperature, the manufactured metal alloys are ferromagnetic. For part of the alloys listed in the table, the martensite reaction transformation temperatures are near to room temperature, as well as the austenite reaction temperatures. Thus the martensite reaction is made to take place substantially at room temperature, and said alloys are so-called room temperature alloys. By adjusting composition and structure, there are obtained so-called high temperature alloys, where the transformation temperatures are within the range 50-80° C., and the operational area ranges from a low temperature up to the transformation temperature. Most of the alloys listed in the table are among said high temperature alloys.

Alloys produced according to the method of the invention were also subjected to experiments for defining stretch and bend. At best, a stretch measured at room temperature was for a tetragonal 5M structure 6%, and for an orthorhombic 7M structure 10%.

The invention claimed is:

1. A method for producing magnetically active shape memory metal alloy containing nickel, manganese and gallium, comprising:
   a) melting nickel and manganese to form a nickel-manganese master alloy,
   b) cooling the master alloy,
   c) crushing the master alloy,
   d) adding gallium to the crushed master alloy,
   e) melting the crushed master alloy with the added gallium,
   f) homogenizing the melt essentially at the melting temperature,
   g) pouring the nickel-manganese-gallium alloy from step f), and
   h) subjecting the nickel-manganese-gallium alloy from step g) to directional solidification at 10-100° C. below the liquidus temperature of said nickel-manganese-gallium alloy.

2. A method according to claim 1, comprising placing the gallium in a crucible, adding the crushed master alloy to the crucible, and melting the crushed master alloy with the gallium.

3. A method for producing magnetically active shape memory metal alloy containing nickel, manganese and gallium, comprising:
   a) melting nickel and gallium to form a nickel-gallium master alloy,
   b) cooling the master alloy,
   c) crushing the master alloy,
   d) adding manganese to the crushed master alloy,
   e) melting the crushed master alloy with the added manganese,
   f) homogenizing the melt essentially at the melting temperature,
   g) pouring the nickel-manganese-gallium alloy from step f), and
   h) subjecting the nickel-manganese-gallium alloy from step g) to directional solidification at 10-100° C. below the liquidus temperature of said nickel-manganese-gallium alloy.

4. A method according to claim 3, comprising placing the manganese in a crucible, adding the crushed master alloy to the crucible, and melting the crushed master alloy with the manganese.

* * * * *